(12) United States Patent
Jiang et al.

(10) Patent No.: US 12,283,453 B2
(45) Date of Patent: Apr. 22, 2025

(54) CREATING MULTIPLE ELECTRON BEAMS WITH A PHOTOCATHODE FILM

(71) Applicant: KLA Corporation, Milpitas, CA (US)

(72) Inventors: Xinrong Jiang, Palo Alto, CA (US); Youfei Jiang, Milpitas, CA (US); Michael Steigerwald, Milpitas, CA (US); Ralph Nyffenegger, Palo Alto, CA (US)

(73) Assignee: KLA Corporation, Milpitas, CA (US)

( * ) Notice: Subject to any disclaimer, the term of this patent is extended or adjusted under 35 U.S.C. 154(b) by 401 days.

(21) Appl. No.: 17/830,244

(22) Filed: Jun. 1, 2022

(65) Prior Publication Data

US 2023/0395349 A1    Dec. 7, 2023

(51) Int. Cl.
*H01J 37/073*    (2006.01)
*H01J 37/12*    (2006.01)
*H01J 37/14*    (2006.01)
*H01J 37/147*    (2006.01)
*H01J 37/22*    (2006.01)
*H01J 37/28*    (2006.01)

(52) U.S. Cl.
CPC ............ *H01J 37/073* (2013.01); *H01J 37/12* (2013.01); *H01J 37/14* (2013.01); *H01J 37/1472* (2013.01); *H01J 37/22* (2013.01); *H01J 37/28* (2013.01); *H01J 2237/0492* (2013.01); *H01J 2237/06333* (2013.01); *H01J 2237/103* (2013.01); *H01J 2237/2448* (2013.01)

(58) Field of Classification Search
CPC .......... H01J 37/073; H01J 37/12; H01J 37/14; H01J 37/1472; H01J 37/22; H01J 37/28; H01J 2237/0492; H01J 2237/06333; H01J 2237/103; H01J 2237/2448
See application file for complete search history.

(56) References Cited

U.S. PATENT DOCUMENTS

| | | | |
|---|---|---|---|
| 6,215,128 B1 | 4/2001 | Mankos et al. |
| 6,376,985 B2 | 4/2002 | Lee et al. |
| 6,724,002 B2 | 4/2004 | Mankos et al. |
| 6,759,800 B1 | 7/2004 | Fernandez et al. |
| 7,301,263 B2 | 11/2007 | Maldonado et al. |
| 10,090,131 B2 | 10/2018 | Jiang et al. |
| 10,573,481 B1 | 2/2020 | Katsap |

(Continued)

FOREIGN PATENT DOCUMENTS

| | | | |
|---|---|---|---|
| JP | 6403045 B2 | 10/2018 |
| JP | 6568646 B2 | 8/2019 |

(Continued)

OTHER PUBLICATIONS

PCT/US2023/024074, International Search Report, Oct. 4, 2023.

(Continued)

*Primary Examiner* — Nicole M Ippolito
*Assistant Examiner* — Hanway Chang
(74) *Attorney, Agent, or Firm* — HUSE IP Law

(57) ABSTRACT

An electron-beam device includes a laser and a photocathode film. The photocathode film has a front side and a back side and emits a plurality of electron beamlets when illuminated from the back side using the laser. The electron-beam device also includes electrodes to extract the plurality of electron beamlets from the front side of the photocathode film and to control shapes of the plurality of electron beamlets.

28 Claims, 10 Drawing Sheets

(56) References Cited

U.S. PATENT DOCUMENTS

| | | | |
|---|---|---|---|
| 10,741,354 | B1 | 8/2020 | Delgado et al. |
| 10,748,737 | B2 | 8/2020 | Ioakeimidi et al. |
| 10,748,739 | B2 | 8/2020 | Jiang et al. |
| 10,971,326 | B2 | 4/2021 | Mohammadi-Gheidari et al. |
| 11,056,312 | B1 | 7/2021 | Jiang et al. |
| 11,145,485 | B2 | 10/2021 | Inoue et al. |
| 11,251,011 | B2 | 2/2022 | Ohshima et al. |
| 2001/0038263 | A1 | 11/2001 | Lee et al. |
| 2004/0159787 | A1 | 8/2004 | Nakasuji et al. |
| 2005/0264148 | A1 | 12/2005 | Maldonado et al. |
| 2016/0358743 | A1* | 12/2016 | Pan ................. H01J 37/3177 |
| 2023/0066086 | A1 | 3/2023 | Jiang |
| 2023/0109032 | A1 | 4/2023 | Jiang et al. |

FOREIGN PATENT DOCUMENTS

| | | | |
|---|---|---|---|
| JP | 2021174615 | A | 11/2021 |
| WO | 2007132459 | A2 | 11/2007 |
| WO | 2021084684 | A1 | 5/2021 |

OTHER PUBLICATIONS

PCT/US2023/024074, Written Opinion of the International Searching Authority, Oct. 4, 2023.

A. Halavanau et al., "Spatial Control of Photoemitted Electron Beams using a Micro-Lens-Array Transverse-Shaping Technique," Phys. Rev. Accel. Beams 20, 103404 (Oct. 26, 2017).

D. Sato et al., "Multiple electron beam generation from InGaN photocathode," Journal of Vacuum Science & Technology B 39, 062209 (2021).

X. Jiang et al., "Photoemission from gold thin films for application in multiphotocathode arrays for electron beam lithography," J. Vac. Sci. Technol. B 16(6), pp. 3374-3379, Nov./Dec. 1998.

* cited by examiner

CREATING MULTIPLE ELECTRON BEAMS WITH A PHOTOCATHODE FILM

TECHNICAL FIELD

This disclosure relates to electron optics, and more specifically to creating multiple electron beams in an electron-beam device.

BACKGROUND

Scanning electron microscopes (SEMs) have long been used for inspection applications such as semiconductor-wafer inspection. Traditionally, SEMs have had a single electron beam. But more recently, SEMs with multiple electron beams (i.e., electron beamlets) have been developed. Multiple electron beamlets may be created from a single electron source by using an aperture array to split a global electron beam into the electron beamlets. The aperture array may be accompanied by a micro-stigmator array, a micro-deflector array, and a micro-lens array.

The throughput of a SEM (or other electron-beam device) depends on the number of beamlets: the higher the number of beamlets, the higher the throughput. Increasing the number of beamlets, however, presents significant challenges. For example, as the emission angle of the electron source increases, the angular intensity distribution of the global electron beam, and thus of the beamlets, becomes less homogenous. Also, the increased field of view that comes with an increased number of beamlets results in higher field curvature, astigmatism, and distortion.

SUMMARY

In some embodiments, an electron-beam device includes a laser and a photocathode film. The photocathode film has a front side and a back side and emits a plurality of electron beamlets when illuminated from the back side using the laser. The electron-beam device also includes electrodes to extract the plurality of electron beamlets from the front side of the photocathode film and to control shapes of the plurality of electron beamlets.

In some embodiments, a method of operating an electron-beam device includes illuminating a back side of a photocathode film using a laser, causing the photocathode film to emit a plurality of electron beamlets. The method also includes extracting the plurality of electron beamlets from a front side of the photocathode film and directing the plurality of electron beamlets to a target, to inspect the target.

BRIEF DESCRIPTION OF THE DRAWINGS

For a better understanding of the various described embodiments, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

In electron optics, lensing action is provided by electric and/or magnetic fields. The components used to generate those fields may be referred to as lenses, as may the fields themselves. A particular component may be part of multiple lenses. For example, a particular component may be both the final component of a first lens and the initial component of a second lens.

Figure 1:
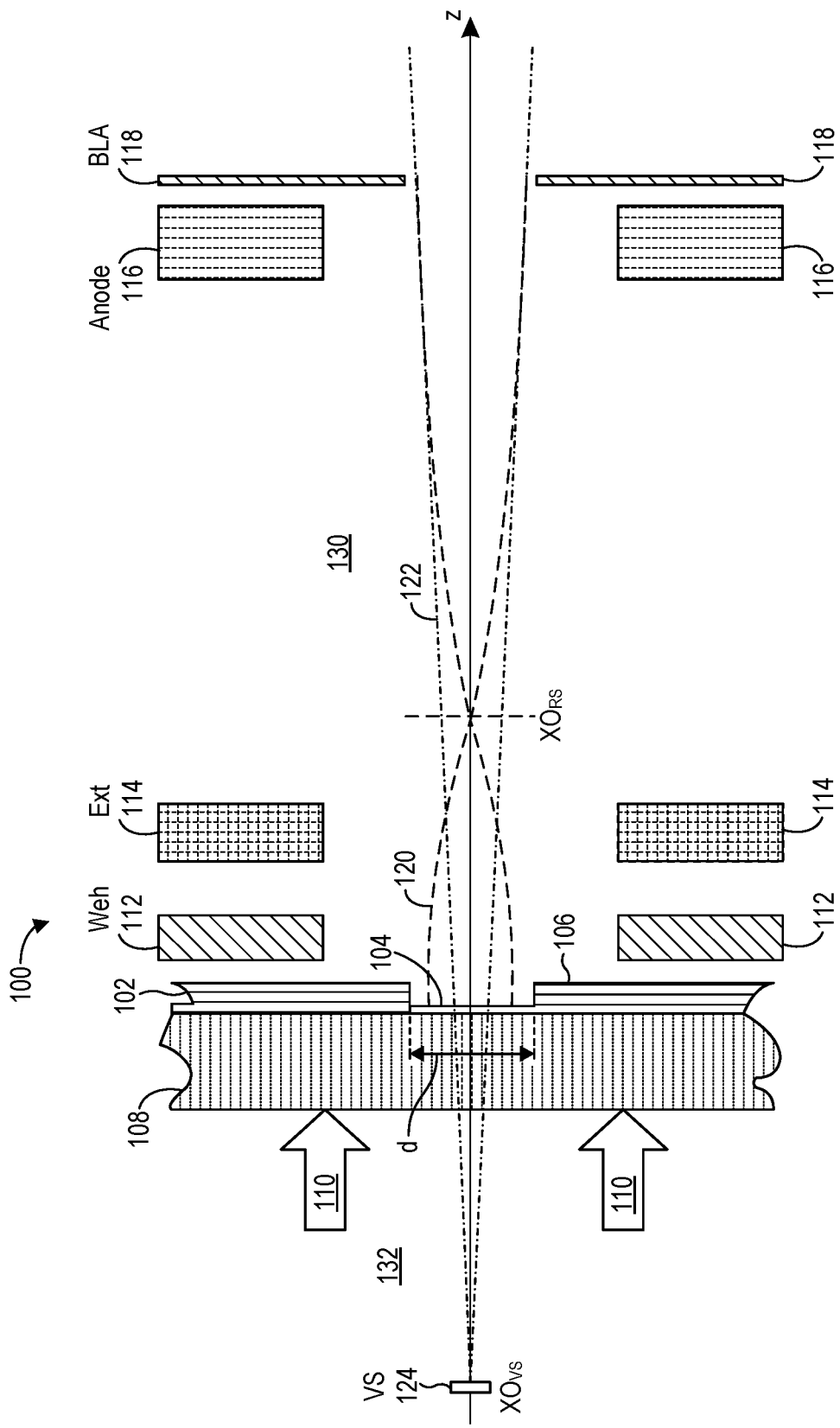
FIG. 1 is a cross-sectional side view, along the electron-optical column, of a portion of an electron-beam device, in accordance with some embodiments.

FIG. 1 is a cross-sectional side view, along the electron-optical column, of a portion of an electron-beam device 100, in accordance with some embodiments. In some embodiments, the electron-beam device 100 is a SEM used to inspect targets (e.g., semiconductor wafers). The electron-beam device 100 includes a photocathode film 102 disposed on a substrate 108. The photocathode film 102 is patterned to include an emission region 104 (e.g., a circular region with a diameter d, which may be in the range of 10-30 um) and a non-emission region 106. The emission region 104 is surrounded by the non-emission region 106 and is thinner than the non-emission region 106. For example, the emission region 104 has a substantially uniform (to within manufacturing tolerances) first thickness and the non-emission region 106 has a substantially uniform (to within manufacturing tolerances) second thickness that is thicker than the first thickness.

The photocathode film 102 has a back side that faces the substrate 108 and a front side that faces outward away from the substrate 108. The photocathode film 102 is disposed on a front side of the substrate 108. The substrate 108 may be illuminated with light 110 (e.g., laser light) from the back side of the substrate 108 (i.e., from the side opposite to the side on which the photocathode film 102 is disposed). The light 110 is provided by a light source (e.g., laser 501, FIG. 5). The substrate 108 is transparent to the light 110, such that illuminating the substrate 108 with the light 110 illuminates the back side of the photocathode film 102 with the light 110. The light 110 illuminates both the emission region 104 and the non-emission region 106. This illumination causes the emission region 104 to emit electrons, in accordance with the photoelectric effect.

In some embodiments, the photocathode film 102 is gold. For example, the photocathode film 102 is a gold film with step layers. The film thickness in the emission region 104 may be in a range between 10-20 nm and the film thickness in the non-emission region 106 may be at least five times the thickness of the layer in the emission region 104. The thickness of the non-emission region 106 prevents emission of electrons from the non-emission region 106. Gold film is a useful photoemitter because of its stability and well-characterized photoemission properties. The work function of gold film is near 4.2 eV, which is well-matched to available laser wavelengths. Since the maximum energy spread of photoemitted electrons is the energy difference between the photon energy and the work function, by using a frequency-doubled argon laser to provide the light 110 at a wavelength of 257 nm (4.8 eV), the energy spread can be held to a half-width of 0.6 eV or less.

Other examples of the photocathode film 102 include, without limitation, III-V semiconductors, cesium telluride (CsTe), and chalcogenides. In some embodiments, the photocathode film 102 is a material with negative electron affinity. In some embodiments, the substrate 108 is sapphire.

The portion of the electron-beam device 100 shown in FIG. 1 also has gun electron optics, which include a Wehnelt electrode (Weh) 112, an extractor electrode (Ext) 114, and an anode 116. The Wehnelt electrode 112 is disposed between the front side of the photocathode film 102 and the extractor electrode 114. The extractor electrode 114 is disposed between the Wehnelt electrode 112 and the anode 116. The extractor electrode 114 extracts an electron beamlet 120 from the emission region 104 of the photocathode film 102 and directs the electron beamlet 120 into an acceleration region between the extractor electrode 114 and the anode 116. The electron beamlet 120 is composed of electrons emitted by the emission region 104 in response to illumination of the photocathode film 102 with the light 110. The Wehnelt electrode 112 controls the beam shape of the electron beamlet 120 after emission from the emission region 104 of the photocathode film 102. The anode 116 accelerates the electron beamlet to a desired beam energy (BE). Each of the electrodes 112, 114, and 116 includes a respective bore aligned with the emission region 104 to allow passage of the electron beamlet 120 through the electrode. The photocathode film 102, Wehnelt electrode 112, extractor electrode 114, and anode 116 are biased with respective voltages $V_{RS}$, $V_{Weh}$, $V_{Ext}$, and $V_{BE}$. The anode may be grounded (i.e., $V_{BE}=0$).

In some embodiments, the light 110 is pulsed (e.g., by pulsing the laser 501, FIG. 5), resulting in pulsing of the electron beamlet 120. In some embodiments, the light 110 is circularly polarized, resulting in polarization of (i.e., a polarization-like wave motion of electrons in) the electron beamlet 120.

A beam-limiting aperture (BLA) 118 is disposed after the anode 116 along the z-axis (and along the path of the electron beamlet 120), such that the anode 116 is disposed between the extractor electrode 114 and the beam-limiting aperture 118. The beam-limiting aperture 118 has a bore size (e.g., diameter) smaller than the bore size of the bore in the anode 116. The bore size of the beam-limiting aperture 118 is chosen to select a central portion of the electron beamlet 120, thus allowing the central portion to pass, while blocking and thus discarding non-central portions of the electron beamlet 120. In this manner, the beam-limiting aperture 118 controls geometric aberration blurring for the electron beamlet 120. The beam-limiting aperture 118 may be biased with the same voltage VBE as the anode 116 (e.g., may be grounded).

The source of the electron beamlet 120, which is actually the emission region 104 of the photocathode film 102, may be modeled with a virtual source 124 (XOvs) behind the substrate 108. In this modeling, a real beam crossover $XO_{RS}$ of the electrons in the electron beamlet 120, as created using the extractor electrode 114, is image-formed. The $XO_{RS}$ is the object of the $XO_{VS}$, and the $XO_{VS}$ is on the image side of the anode 116 with the same potential $V_{BE}$ as the anode 116 with respect to the beam energy of the electron beamlet 120. Virtual-source trajectories 122 are accordingly straight lines, which are the tangential lines of the real-source trajectories of the electrons of the electron beamlet 120 in the exit plane of the beam limiting aperture 118.

Magnification M from $XO_{RS}$ to $XO_{VS}$ is given by:

$$M = \frac{2\rho^{1/2}}{3\rho^{1/2} - 1} \text{ and } \rho = \frac{V_{BE}}{V_{XORS}} \qquad (1)$$

where $V_{BE}$ is the anode potential and $V_{XORS}$ is the beam potential at $XO_{RS}$. The position of the virtual source 124 is given by:

$$L_{VS} = \frac{4\rho(L_{RS} - z_{XORS})}{3\rho + 2\rho^{1/2} - 1} \qquad (2)$$

where $L_{VS}$ is the distance between the virtual source 124 and the anode 116, $L_{RS}$ is the distance between the real source (i.e., the plane of the emission region 104 in the photocathode film 102) and the anode 116, and $z_{XORS}$ is the real beam crossover ($XO_{RS}$) position (i.e., the distance between the plane of the emission region 104 and $XO_{RS}$).

The magnification M of Eq. (1) and the virtual-source position $L_{VS}$ of Eq. (2) may be estimated for high beam energies (e.g., 30 keV or higher). In this case the factor ρ in Eq. (1) is much greater than 1×, because the $XO_{RS}$ is near the Wehnelt electrode 112 and extractor electrode 114 and the potential $V_{XORS}$ is much lower than $V_{BE}$ before the beam is accelerated. Accordingly, Eq. (1) and Eq. (2) may be approximated by M≈2/3=0.67 and $L_{VS}$≈4*($L_{RS}-z_{XORS}$)/3≈1.33*$L_{RS}$, respectively.

The portion of the photocathode film 102 shown in FIG. 1 includes only a single emission region 104 to emit a single electron beamlet 120. Similarly, each of the portions of the electrodes 112, 114, and 116 shown in FIG. 1 only has a corresponding single bore, and only a single beam-limiting aperture 118 is shown. The photocathode film 102, however, may include a plurality of emission regions 104 separated from each other by the non-emission region 106. Each of the emission regions 104 emits a respective electron beamlet 120 in response to illumination of the back side of the photocathode film 102 by the light 110. No electron beamlets are emitted from the non-emission region 106, due to its thickness. The resulting plurality of electron beamlets 120 is extracted from the emission regions 104 using the extractor electrode 114, shaped using the Wehnelt electrode 112, and accelerated using the anode 116. The electrodes 112, 114, and 116 each include a plurality of bores corresponding to the plurality of emission regions 104 and the plurality of electron beamlets 120. Respective bores are aligned with respective emission regions 104 for respective electron beamlets 120. The beam-limiting aperture 118 shown in FIG. 1 is one of a plurality of beam-limiting apertures 118 to select the central regions and block the non-central regions of the plurality of electron beamlets 120. Respective beam-limiting apertures 118 of the plurality of beam-limiting apertures 118 select the central regions and block the non-central regions of respective electron beamlets 120 of the plurality of electron beamlets 120. Respective beam-limiting apertures 118 are aligned with respective emission regions 104 and respective bores of the electrodes 112, 114, and 116.

In some embodiments, each of the emission regions 104 in the photocathode film has the same diameter d (e.g., to within manufacturing tolerances). The emission regions 104 may be arranged in an array and evenly spaced (e.g., with rotational symmetry). The bores of the electrodes 112, 114, and 116 may have the same arrangement, as may the plurality of beam-limiting apertures 118.

Figure 2:
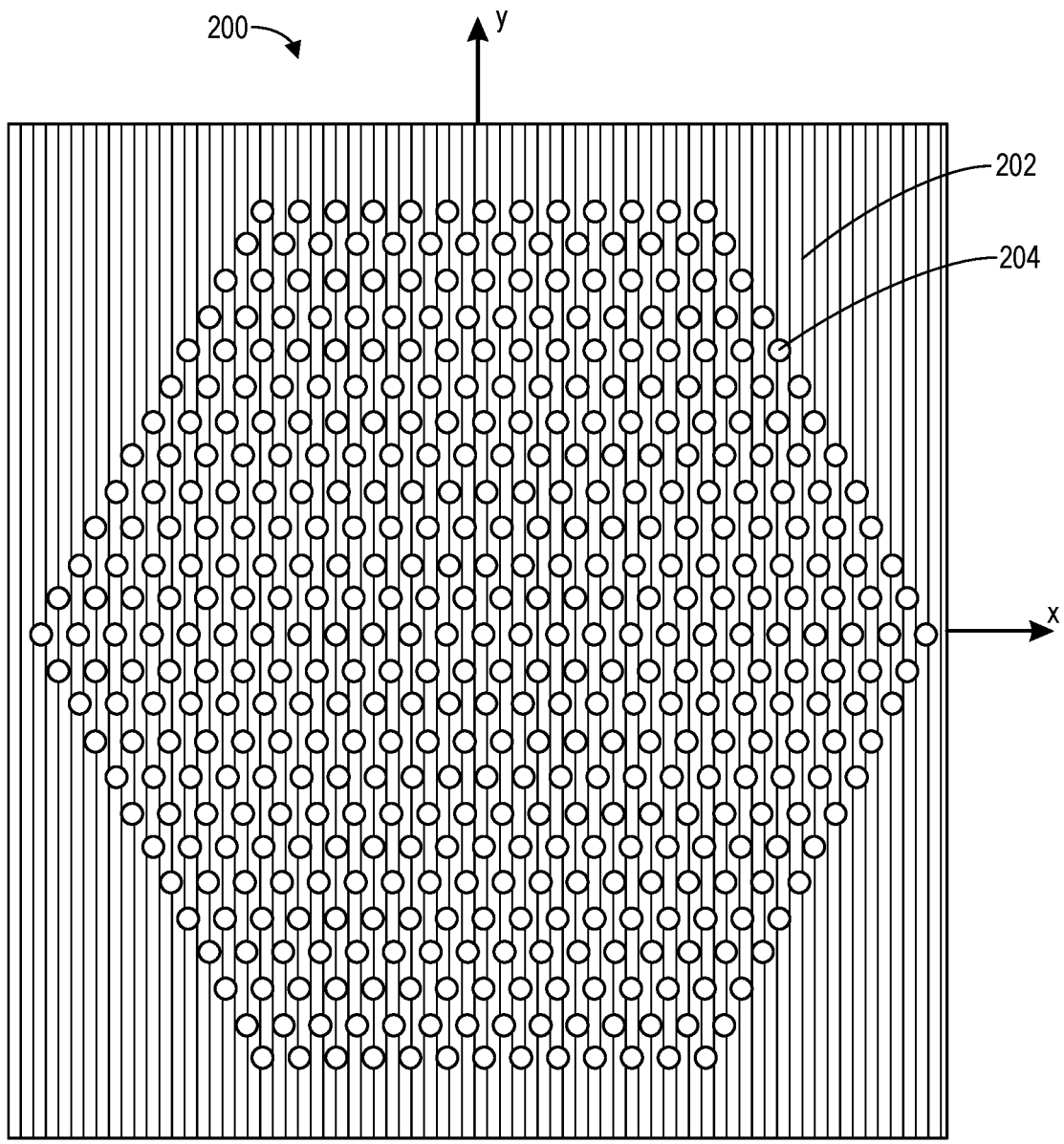
FIG. 2 is a plan view of a patterned photocathode film for use in an electron-beam device, in accordance with some embodiments

FIG. 2 is a plan view of a patterned photocathode film 200 for use in an electron-beam device, in accordance with some embodiments. The photocathode film 200 is an example of the photocathode film 102 (FIG. 1). The photocathode film 200 includes a plurality of emission regions 204 surrounded by a non-emission region 202. The emission regions 204 are examples of the emission region 104 and the non-emission region 202 is an example of the non-emission region 106 (FIG. 1). The emission regions 204 are arranged in a hexagonal array in the x-y plane, which is perpendicular to the z-axis of FIG. 1. The hexagonal array is desirable because a hexagon has a relatively high degree of rotational symmetry. Alternatively, the emission regions 204 may be arranged in a different pattern (e.g., with a different degree of rotational symmetry). In some embodiments, the emission regions 204 are circular in the x-y plane with a diameter d in the range of 10-30 um and a spacing (i.e., pitch) s in the range of 75-150 um.

The number of emission regions 204 determines and equals the number of electron beamlets 120 emitted from the photocathode film 200. For the hexagonal pattern of FIG. 2, the total number $MEB_{tot}$ of electron beamlets 120 is:

$$MEB_{tot} = \frac{1}{4}(1 + 3M_x^2) \quad (1)$$

where $M_x$ is the number of emission regions 204 along an axis (e.g., the x-axis) of the hexagon. For example, within five rings (i.e., $M_x=11$) of the hexagonally-distributed emission regions 204 in FIG. 2, the total number of electron beamlets 120 is 91 (i.e., $MEB_{tot}=91$). Within 10 rings of FIG. 2 (i.e., $M_x=21$), the total number of electron beamlets 120 is 331 (i.e., $MEB_{tot}=331$). The number of rings in the hexagon may be higher or lower than the number of rings shown in FIG. 2.

The photocathode film 200 may be fabricated by depositing a thick film (e.g., of gold) onto a substrate (e.g., of sapphire), photolithographically defining and etching holes of diameter d and spacing s in the film (e.g., down to the substrate), and subsequently depositing a thin film (e.g., of the same material as the thick film, for example, gold) on the thick film and in the holes. The photocathode film 200 can be illuminated (e.g., from the back side, using light 110, FIG. 1), resulting in emission of electrons from the emission regions 204 but not from the thicker non-emission region 202.

The Wehnelt electrode 112, extractor electrode 114, anode 116, and plurality of beam-limiting apertures 118 may be created with arrays of bores (i.e., apertures) in the same arrangement as the arrangement of emission regions 204 in the photocathode film 200. The bores have identical spacing s as the emission regions 204 and are aligned with the emission regions 204. The bores of the Wehnelt electrode 112, extractor electrode 114, and anode 116 have diameters that are larger than the diameter of the emission regions 204. The bores (i.e., apertures) of the plurality of beam-limiting apertures 118 have a diameter smaller than the diameter of the bores of the Wehnelt electrode 112, extractor electrode 114, and anode 116 (i.e., the bore size of the plurality of beam-limiting apertures 118 is smaller than the bore size(s) of the Wehnelt electrode 112, extractor electrode 114, and anode 116). Thus, instead of showing a photocathode film 200, FIG. 2 may be considered to show a conductive (e.g., metallic) plate for use as the Wehnelt electrode 112, extractor electrode 114, anode 116, or plurality of beam-limiting apertures 118.

Figure 3:
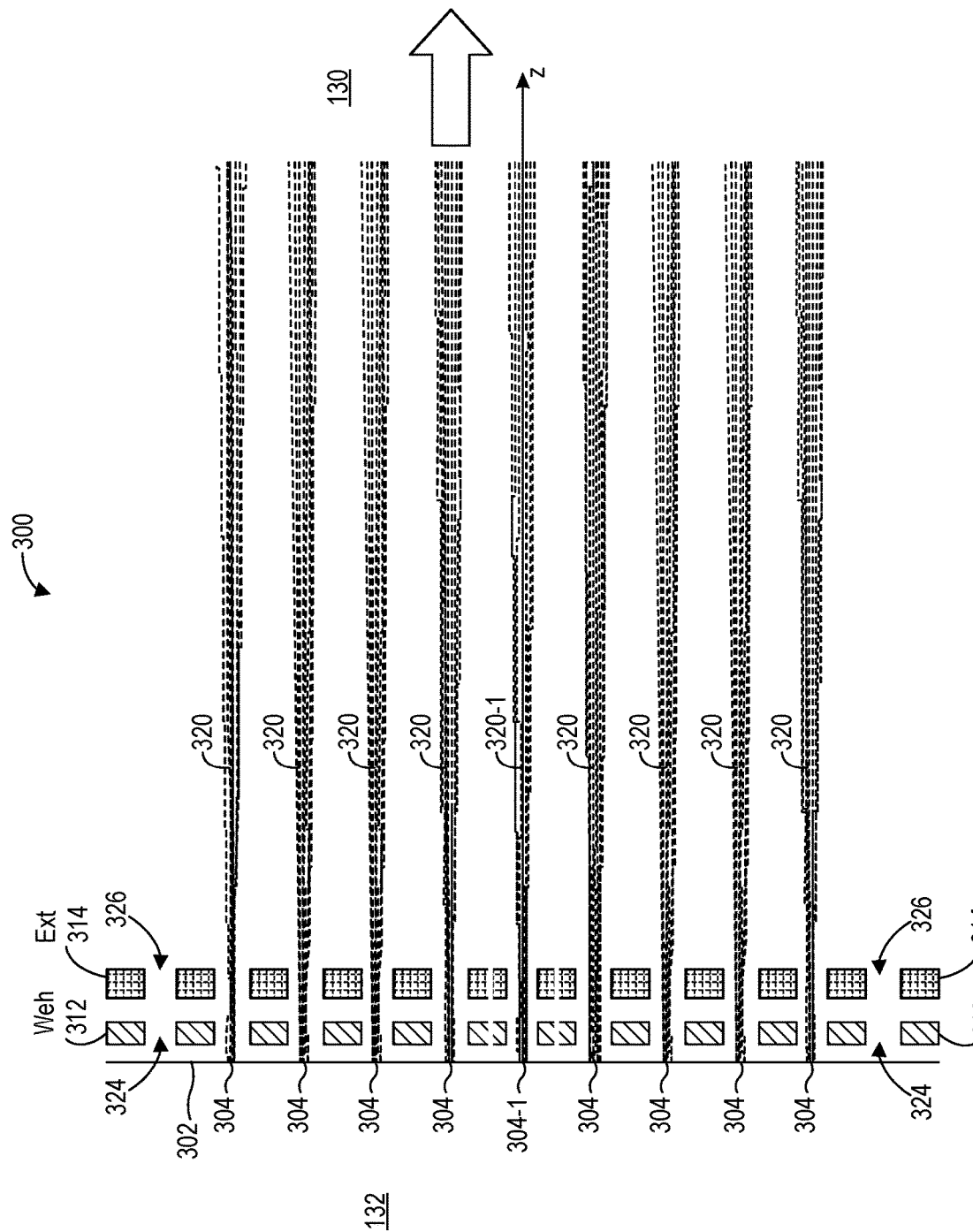
FIG. 3 is a cross-sectional side view, along the electron-optical column, of a portion of an electron-beam device, and shows computer-simulated electron trajectories for a plurality of electron beamlets, in accordance with some embodiments.

FIG. 3 is a cross-sectional side view, along the electron-optical column, of a portion of an electron-beam device 300, in accordance with some embodiments. The electron-beam device 300 includes a photocathode film 302, Wehnelt electrode 312, and extractor electrode 314, which may be examples of the photocathode film 102, Wehnelt electrode 112, and extractor electrode 114 (FIG. 1). Alternatively, the photocathode film 302 may be an example of the photocathode film 906 (FIG. 9) (e.g., with the Wehnelt electrode 312 and extractor electrode 314 being examples of the Wehnelt electrode 112 and extractor electrode 114). The electron-beam device 300 may also include an anode (e.g., anode 116, FIG. 1) and a plurality of beam-limiting apertures (e.g., including beam-limiting aperture 118, FIG. 1) situated to the right of the portion of the electron-beam device 300 shown in FIG. 3. The photocathode film 302 may be an example of the photocathode film 200 (FIG. 2), with the Wehnelt electrode 312, extractor electrode 314, anode, and plurality of beam-limiting apertures being configured accordingly.

Figure 9:
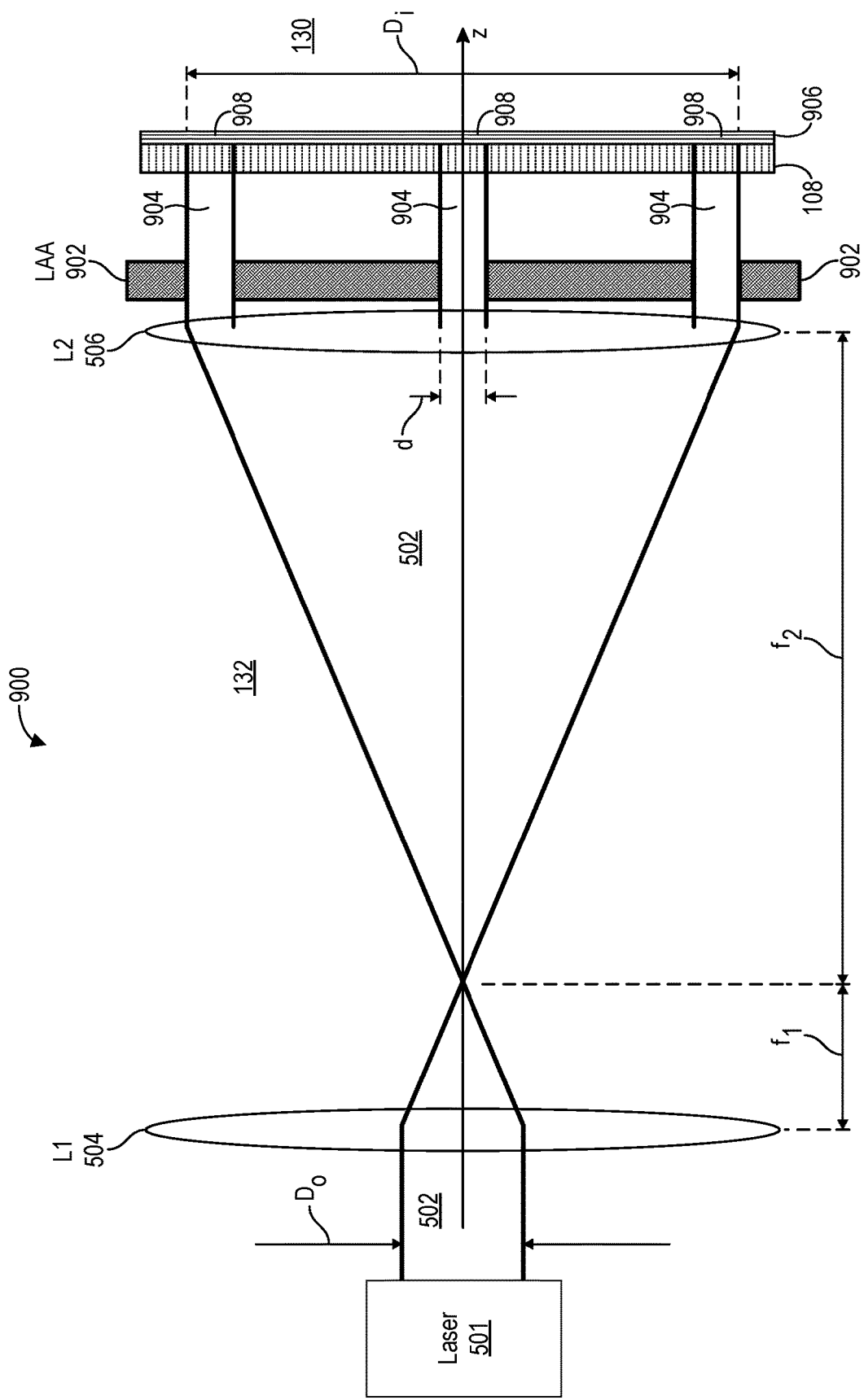
FIG. 9 shows optics for an electron-beam device with a photocathode film that emits a plurality of electron beamlets when illuminated from the back side by a plurality of optical beamlets, in accordance with some embodiments.

FIG. 3 shows computer-simulated ray-tracing of trajectories of electrons in electron beamlets 320 (including a central electron beamlet 320-1), which are emitted from respective emission regions 304 of the photocathode film 302. The emission regions 304 (which include a central emission region 304-1) may be examples of the emission regions 104 (FIG. 1) or regions illuminated by optical beamlets 904 (FIG. 9). The trajectories result from biasing the photocathode film 302, Wehnelt electrode 312, extractor electrode 314, and anode with the respective voltages $V_{RS}$, $V_{Weh}$, $V_{Ext}$, and $V_{BE}$. In some embodiments, the emission regions 304 have a diameter in the range of 10-30 um and the bores of the Wehnelt electrode 312, extractor electrode 314, and anode have a diameter in the range of 50-150 um.

In some embodiments, the Wehnelt electrode 312, extractor electrode 314, and/or anode have outer bores that are not for any of the electron beamlets 320 and do not correspond to any of the emission regions 304. These outer bores include outer bores 324 for the Wehnelt electrode 312, outer bores 326 for the extractor electrode 314, and outer bores for the anode that may be aligned with the outer bores 324 and the outer bores 326. These outer bores are dummy bores (i.e., dummy holes) that enhance electrical-field uniformity around the bores through which the electron beamlets 320 pass. For example, the dummy bores surround the bores through which the electron beamlets 320 pass. In examples of FIG. 2 in which FIG. 2 shows a plate for use as the Wehnelt electrode 112, extractor electrode 114, or anode 116, one or more of the outer rings of bores in the hexagon may be dummy bores. The dummy bores reduce electron-trajectory differences between inner and outer electron beamlets 320 (e.g., ensure that the differences are negligible).

Figure 4:
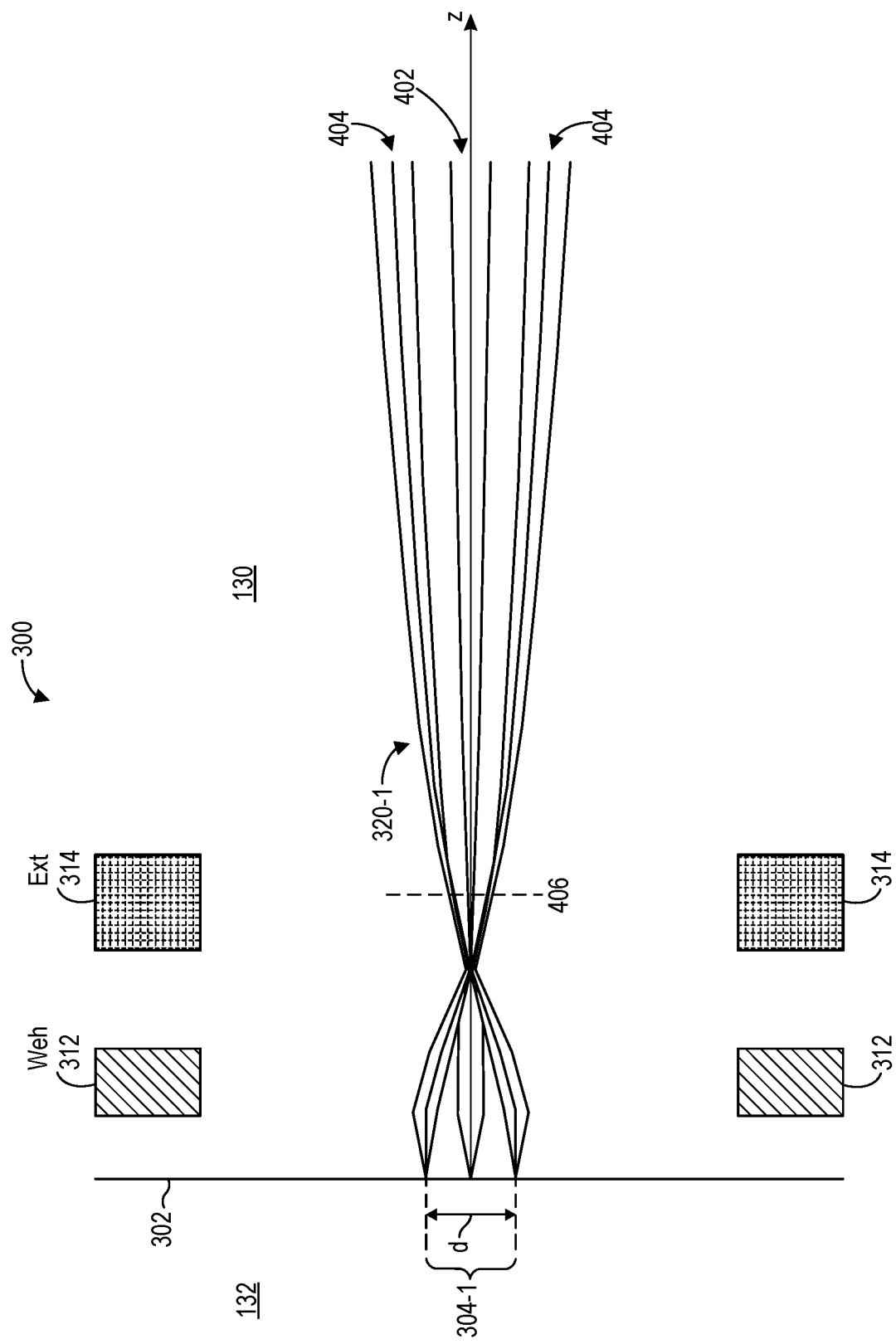
FIG. 4 is an enlarged view of a central electron beamlet in the electron-beam device of FIG. 3, in accordance with some embodiments.

FIG. 4 is an enlarged view of a central electron beamlet 320-1 in the electron-beam device 300 (FIG. 3), in accordance with some embodiments. The central electron beamlet 320-1 is emitted from a central emission region 304-1 of the photocathode film 302. Electron trajectories and optical properties for the central electron beamlet 320-1 may be characterized with the central electron rays 402 and edge electron rays 404, in which a real-source crossover $XO_{RS}$ and real image plane 406 are formed and exhibited.

Returning to FIG. 2, in one example the photocathode film 200 has 331 hexagonally distributed emission regions 204 (i.e., in 10 rings, with $M_x$=21). The emission regions 204 may have a diameter of 20 um and a spacing of 100 um. The emission regions 204 may all be illuminated by a laser beam with a diameter $D_i$=2000 um. According to experimental quantum-efficiency measurements with a gold film having a thickness of 10-20 nm, a 2 W, 257 nm laser can provide a 1 nA electron-beamlet current from each emission region 204, for a total current of 331 nA from all 331 emission regions 204. The laser power may be adjustable from 1 W to 10 W, so the current of each electron beamlet may be adjustable from 0.5 nA to 5 nA, for a total current of 165 nA to 1650 nA from all 331 emission regions 204. Such electron beamlets and corresponding beamlet currents may provide high-throughput target (e.g., wafer) inspection and review in a SEM.

Other examples of adjusting the laser power to the currents of the plurality of electron beamlets are possible. The currents of the plurality of electron beamlets may be adjusted by adjusting the laser power while keeping the settings for the electron-optics in the vacuum chamber 130 unchanged and without having to re-calibrate the electron-optical column.

Figure 5:
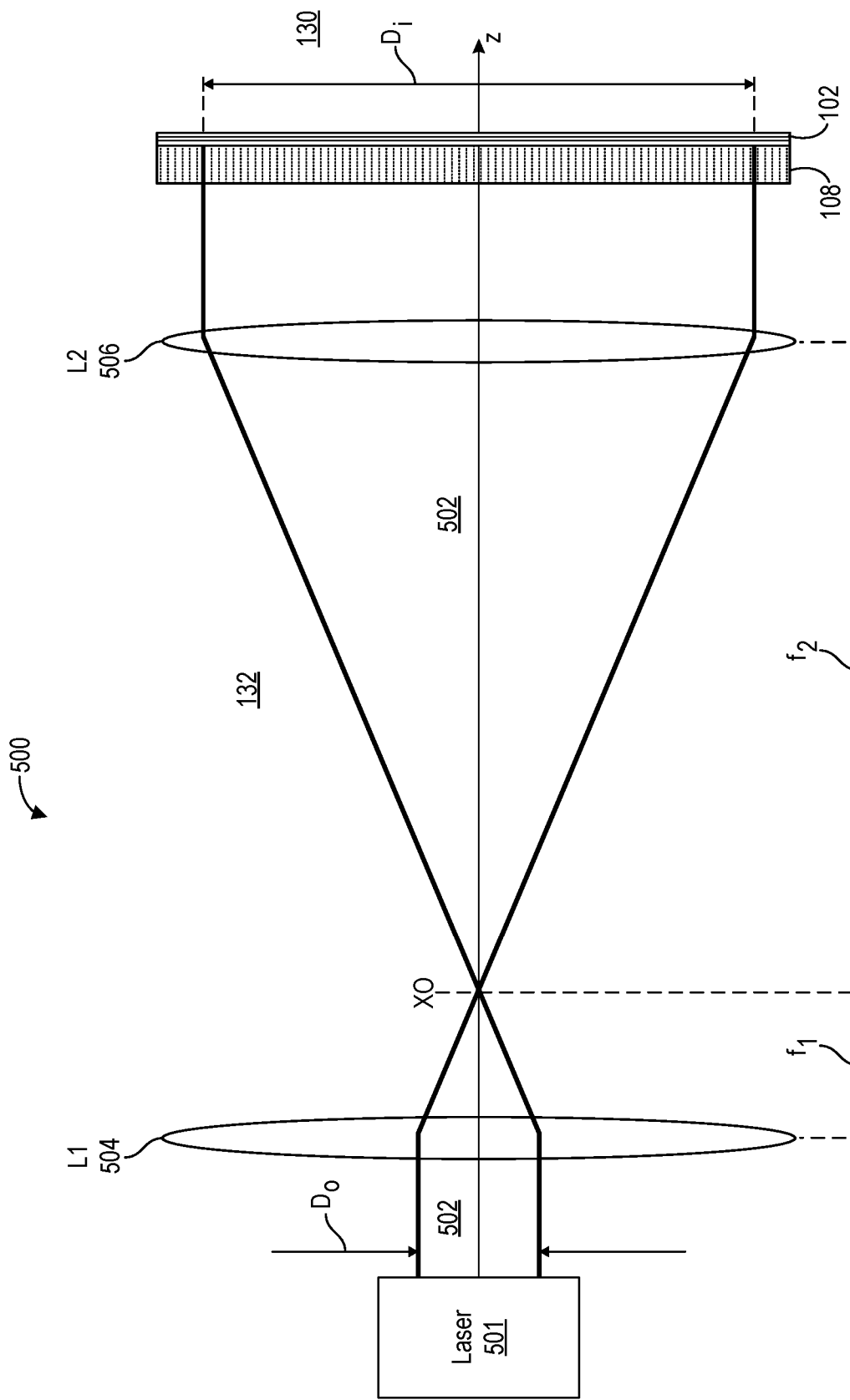
FIG. 5 shows a pair of lenses that magnify the beam size of a laser beam used to illuminate a photocathode film to induce photoemission, in accordance with some embodiments.

Optical lenses may be used to magnify the beam size of a laser beam to illuminate an array of emission regions 104 on a photocathode film 102 (FIG. 1). FIG. 5 shows optics 500 including a pair of lenses 504 and 506, arranged in series along the z-axis, that magnify the beam size of a laser beam 502, in accordance with some embodiments. A laser 501 (e.g., with adjustable laser power) generates the laser beam 502, which is an example of light 110 (FIG. 1). The pair of lenses 504 and 506 thus may be part of the electron-beam device 100 (FIG. 1) (e.g., the electron-beam device 300, FIGS. 3-4). As output by a laser, the laser beam 502 has a beam size $D_0$. After passing through the first lens 504 and the second lens 506, the laser beam 502 has a magnified beam size $D_i$ (e.g., $D_i$ is greater than or equal to 2000 um) sufficient to illuminate the emission regions 104 on the photocathode film 102 (e.g., to illuminate all of the emission regions 204 on the photocathode film 200, FIG. 2). The first lens 504 focuses the laser beam 502 onto a crossover XO and the second lens 506 collimates the laser beam 502. The resulting optical magnification is $D_i/D_0=f_2/f_1$, where $f_1$ is the focal length of the first lens 504 and $f_2$ is the focal length of the second lens 506. In some embodiments, the optical magnification is in the range of 5×-10× (i.e., a factor of 5-10). The magnified laser beam 502 with magnified beam size $D_i$ illuminates the back side of the photocathode film 102 through the substrate 108 to induce photoemission in the emission regions 104 of the photocathode film 102, resulting in emission of electron beamlets 120 from the emission regions 104. Optical magnification of the laser beam 502 does not change the power or wavelength of the laser beam 502.

Figure 6:
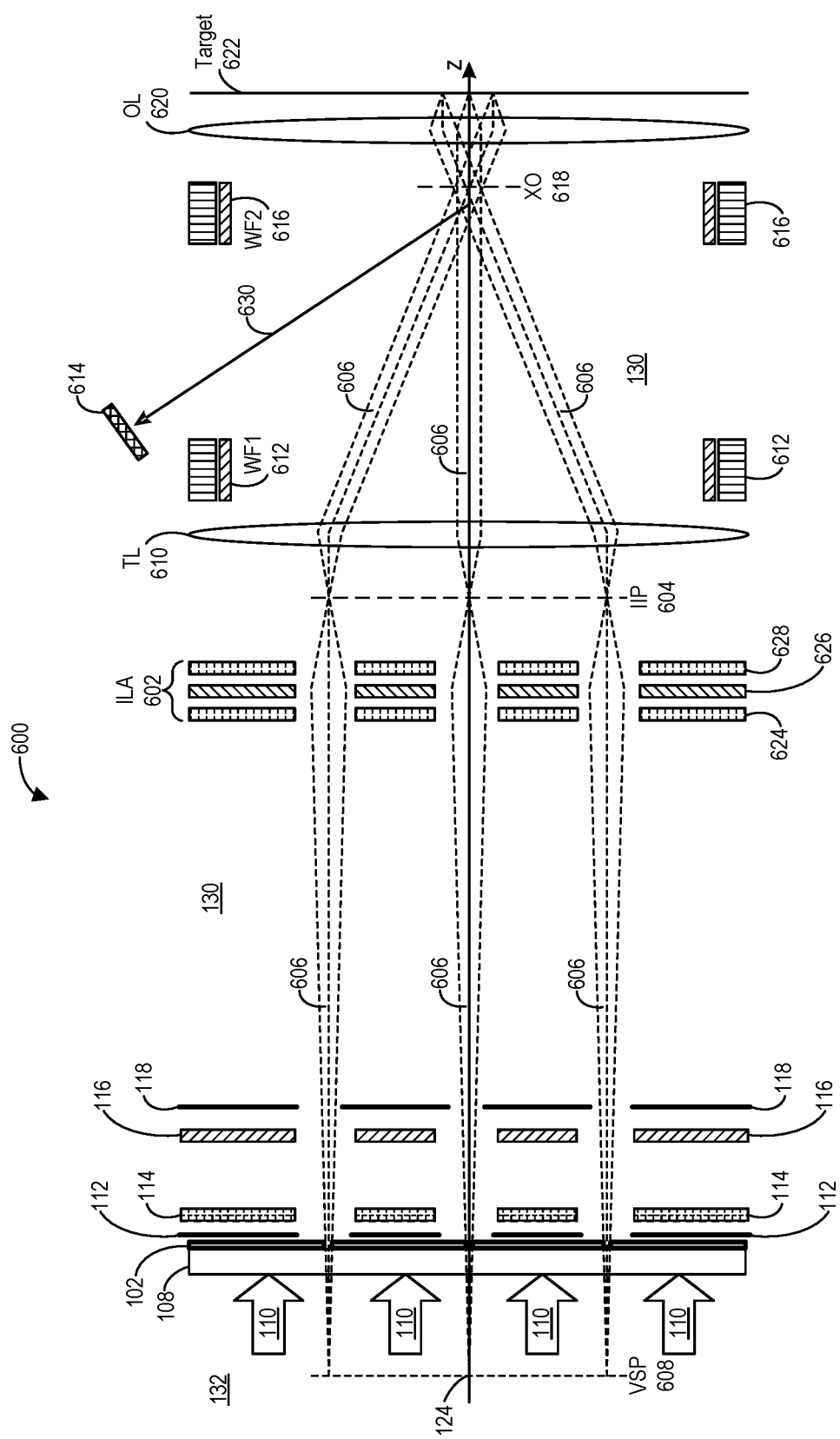
FIG. 6 is a cross-sectional side view, along the electron-optical column, of an electron-beam device that includes an image-lens array disposed between the anode and an intermediate image plane, to focus a plurality of electron beamlets onto the intermediate image plane, in accordance with some embodiments.

In some embodiments, the electron-beam device 100 (FIG. 1) (e.g., the electron-beam device 300, FIGS. 3-4) includes image lensing to focus the plurality of electron beamlets onto an intermediate image plane. FIG. 6 is a cross-sectional side view, along the electron-optical column, of an electron-beam device 600 (e.g., electron-beam device 100, FIG. 1; electron-beam device 300, FIGS. 3-4) in which the image lensing includes an image-lens array (ILA) 602 disposed between the anode 116 and an intermediate image plane 604 (and accordingly, between the plurality of beam-limiting apertures 118 and the intermediate image plane 604), to focus a plurality of electron beamlets 606 onto the intermediate image plane 604. The image-lens array 602 includes respective lenses to focus respective electron beamlets 606 onto the intermediate image plane 604. For example, the image-lens array 602 includes an image lens for each electron beamlet 606 of the plurality of electron beamlets 606, to focus the electron beamlet 606 onto the intermediate image plane 604.

The lenses of the image lens array 602 may be electrostatic lenses or magnetic lenses. For example, the lenses may be Einzel lenses, which are electrostatic lenses with three electrode plates: a left plate 624 closest to the anode 116, a right plate 628 closest to the intermediate image plane 604), and a middle plate 626 between the left plate 624 and the right plate 628. In some embodiments, the three electrode plates 624, 626, and 628 are implemented in accordance with FIG. 2, with hexagonally distributed bores. The bore sizes may be equal or approximately equal to the bore size of the bores in the anode 116. The left plate 624 and the right plate 628 may be grounded, and the middle plate 626 may be biased with a voltage $V_{IL}$ for focusing the electron beamlets 606.

Figure 7:
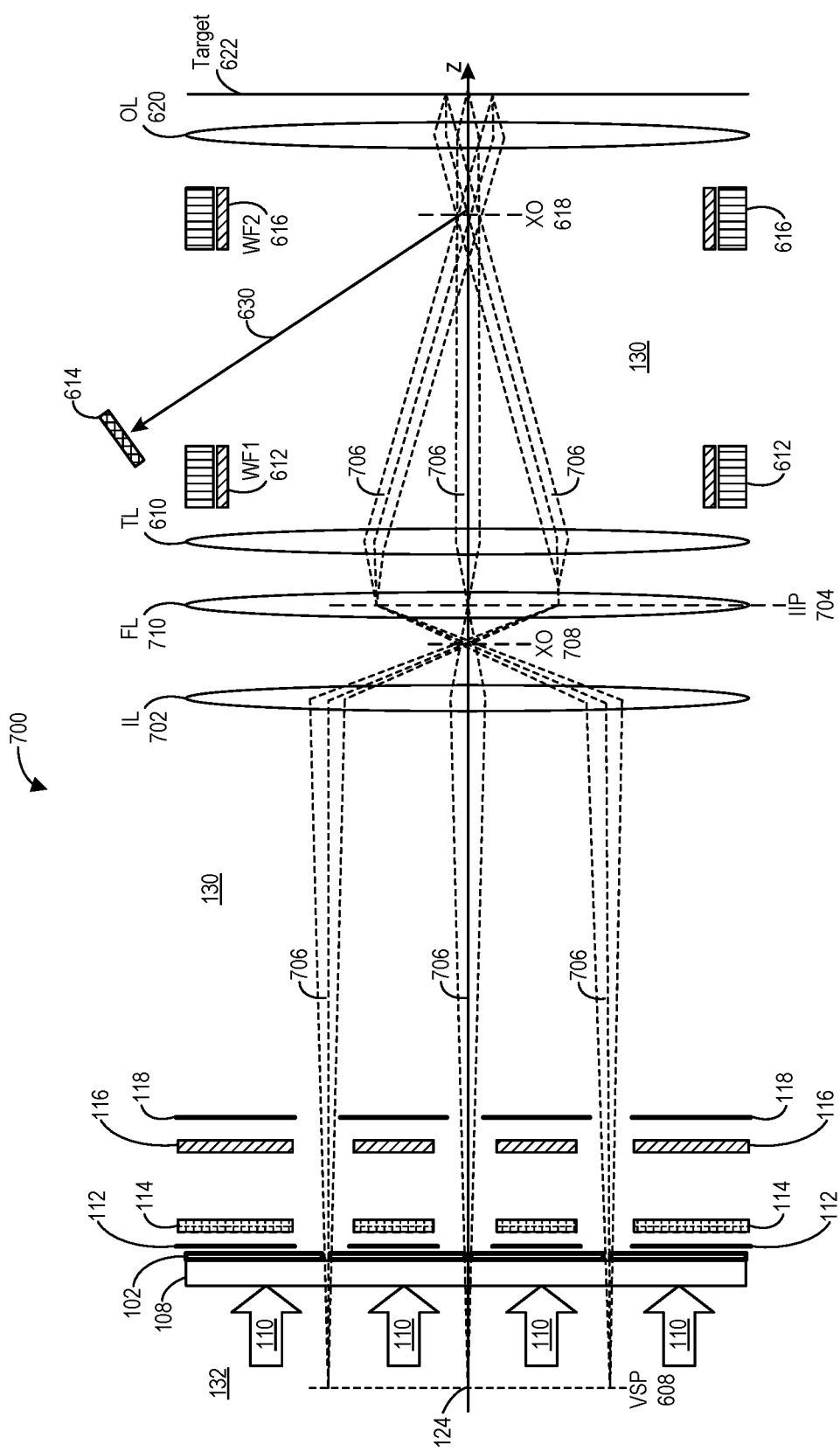
FIG. 7 is a cross-sectional side view, along the electron-optical column, of an electron-beam device that includes a global image lens disposed between the anode and an intermediate image plane, to focus a plurality of electron beamlets onto the intermediate image plane, in accordance with some embodiments.

FIG. 7 is a cross-sectional side view, along the electron-optical column, of an electron-beam device 700 (e.g., electron-beam device 100, FIG. 1; electron-beam device 300, FIGS. 3-4) in which the image lensing includes a global image lens (IL) 702 disposed between the anode 116 and an intermediate image plane 704 (and accordingly, between the plurality of beam-limiting apertures 118 and the intermediate image plane 604), to focus a plurality of electron beamlets 706 onto the intermediate image plane 704, thus image-forming the plurality of electron beamlets 706 in the intermediate image plane 704. The global image lens 702, which has a single bore for the plurality of electron beamlets 706, forms a crossover 708 of the plurality of electron beamlets 706. The crossover 708 is situated between the global image lens 702 and the intermediate image plane 704. The global image lens 702 may be an electrostatic lens or a magnetic lens. A magnetic global image lens allows for high demagnification in the upper column because the image distance may be shortened without introducing high-voltage issues.

The electron-beam device 700 also includes a field lens (FL) 710 to collimate the plurality of electron beamlets 706 after the crossover 708. The field lens 710 is a global lens with a single bore for the plurality of electron beamlets 706. The field lens 710 is coincident with the intermediate image plane 704. For example, the intermediate image plane 704 is in the principal plane of the field lens 704. The field lens 710 may be an electrostatic lens or a magnetic lens.

The electron-optical columns of the electron-beam device 600 (FIG. 6) and the electron-beam device 700 (FIG. 7) include an upper column and a lower column. The upper column may be considered to extend from the virtual-source plane 608 in which the virtual source 124 is situated (or alternatively, from the substrate 108) to the intermediate image plane 704. The lower column may be considered to extend from the intermediate image plane 704 to a target 622 (e.g., a semiconductor wafer) to be inspected (or alternatively, to a stage on which the target 622 is mounted).

The lower columns of the electron-beam devices 600 and 700 include a transfer lens (TL) 610 and an objective lens (OL) 620. The transfer lens 610 is disposed on an opposite side of the intermediate image plane 604 or 704 from the image lensing (e.g., from the image-lens array 602, FIG. 6, or the global image lens 702, FIG. 7). The transfer lens 610 forms a crossover 618 of the plurality of electron beamlets 606 or 706. The crossover 618 is situated between the transfer lens 610 and the objective lens 620. In some embodiments, the crossover 618 is closer to the objective lens 620 than to the transfer lens 610, such that demagnification of the plurality of electron beamlets 606 or 706 occurs. The objective lens 620 focuses the plurality of electron beamlets 606 or 706 onto the target 622 and also decelerates the plurality of electron beamlets 606 or 706 to a desired landing energy. The objective lens 620 is disposed between the crossover 618 and the target 622 (and thus between the crossover 618 and the stage for the target 622). The transfer lens 610 is disposed between the intermediate image plane 604 or 704 and the crossover 618. In the electron-beam device 700, the transfer lens 610 is disposed between the field lens 710 and the objective lens 620. The transfer lens 610 may be an electrostatic lens or a magnetic lens. The objective lens 620 may be an electrostatic lens or a mixed magnetic-electrostatic lens. The transfer lens 610 and the objective lens 620 are global lenses with respective single bores for the plurality of electron beamlets 606 or 706 (i.e., through which the plurality of electron beamlets 606 or 706 passes).

The plurality of electron beamlets 606 or 706 as incident on the transfer lens 610 are collimated, such that the electron beamlets 606 or 706 telecentrically illuminate the transfer lens 610. In the example of the electron-beam device 700 (FIG. 7), the field lens 710 causes the plurality of electron beamlets 706 to telecentrically illuminate the transfer lens 610 by collimating the plurality of electron beamlets 706.

The lower-column electron optics of the electron-beam devices 600 and 700 are projection optics. The projection optics may have a large optical demagnification (e.g., ~10×) with the crossover 618 situated near the objective lens 620, both to reduce the influence of Coulomb interactions on the resolution and to reduce off-axis aberrations for outer-ring electron beamlets 606 or 706. The optical performance (i.e., the resolution of each individual electron beamlet 606 or 706) is largely dominated by Coulomb interactions around the crossover 618. With a purely electrostatic objective lens 620, the effects of the Coulomb interactions are largely reduced and the resolutions improved accordingly. For relatively low beam currents, the effects of the Coulomb interactions around the crossover 618 are decreased, but the source image may degrade the resolutions because of large virtual-source sizes for the plurality of emission regions 104.

According to computer simulations, the real-source crossover ($XO_{RS}$) size may be approximately 300 nm for 20-80% current-rise measurements. The size of the virtual source 124 ($XO_{VS}$) may be approximately 0.67*300 nm≈200 nm. The optical demagnification in the lower column of the electron-beam devices 600 or 700 may be around 10× with a purely electrostatic objective lens 620. The optical demagnification in the upper column of the electron-beam device 700 (FIG. 7) may be higher than 5×, giving a source image at the target 622 that is better than 200/(10*5)=4 nm for relatively low beam currents (e.g., single electron-beamlet currents of less than 1 nA). For higher beam currents, blurring due to the Coulomb interactions around the crossover 618 may dominate over the source image. Coulomb interactions between the electron beamlets 606 or 706 in the upper column are negligible, because the separation between the electron beamlets (e.g., greater than or equal to 100 um) is much larger than the average separation of the electrons in a single electron beamlet 606 or 706.

The image distance of the image-lens array 602 (FIG. 6) or global image lens 702 (e.g., the distance from the virtual source 124 to the intermediate image plane 604 or 704) may be chosen to reduce the focusing voltage and avoid an overly high electrical strength across the gap of the image-lens array 602 (FIG. 6) or global image lens 702 (FIG. 7). For example, the image distance may be greater than or equal to 50 mm, with the length of the upper column from the virtual-source plane 608 to the intermediate image plane 604 or 704 being at least 300 mm.

In addition to the transfer lens 610 and the objective lens 620, the lower columns of the electron-beam devices 600 and 700 also include a first Wien filter 612 and a second Wien filter 616, both of which are disposed between the transfer lens 610 and the objective lens 620. The second Wien filter 616 is closer to the objective lens 620 than is the first Wien filter 612, and the first Wien filter 612 is closer to the transfer lens 610 than is the second Wien filter 616. The first Wien filter 612 thus is disposed between the transfer lens 610 and the second Wien filter 616, and the second Wien filter 616 is disposed between the first Wien filter 612 and the objective lens 620.

The second Wien filter 616 deflects secondary electrons 630 from the target 622 to a detector 614 (e.g., a detector array), which detects the secondary electrons 630. Secondary electrons 630 are electrons from the plurality of electron beamlets 606 or 706 that are scattered from the target 622. By deflecting the secondary electrons 630 from the target 622 to the detector 614, the second Wien filter 616 collects the secondary electrons 630, allowing for inspection of the target 622.

The second Wien filter 616 is sufficiently strong to allow secondary electrons 630 with a deflection angle wide enough for proper imaging of the target 622 to be directed to the detector 614. Such a strong Wien filter generates energy dispersion because there exists source-energy spread (e.g., of 0.6 eV or less, as previously described). This energy dispersion causes blurring of the plurality of electron beamlets 606 or 706. The first Wien filter 612 compensates for the second Wien filter 616 by correcting for this energy dispersion: the energy dispersion generated by the first Wien filter 612 compensates for the energy dispersion generated in the second Wien filter 616, thus reducing or eliminating the blurring.

Figure 8:
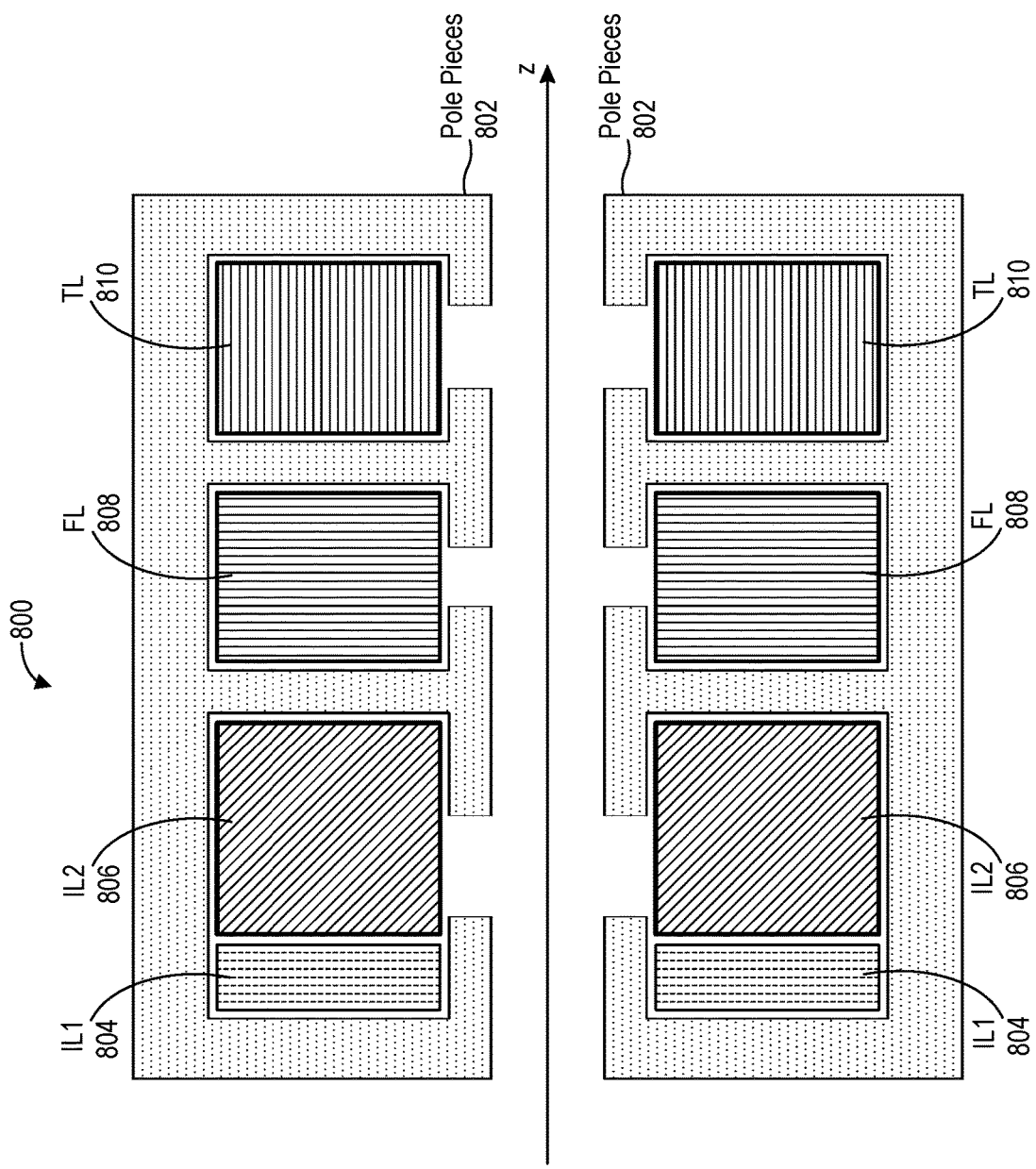
FIG. 8 is a cross-section view of a magnetic-lens stack with magnetic lenses that share pole pieces, in accordance with some embodiments.

FIG. 8 is a cross-sectional view of a magnetic-lens stack 800 with magnetic lenses that share pole pieces 802, in accordance with some embodiments. The magnetic lenses in the magnetic-lens stack 800 include a first image lens 804, a second image lens 806, a field lens 808, and a transfer lens 810. The first image lens 804 and second image lens 806 compose an example of the global image lens 702 (FIG. 7). The field lens 808 and transfer lens 810 are respective examples of the field lens 710 and transfer lens 610 (FIG. 7). The magnetic-lens stack 800 with shared pole pieces 802 allows for tight control of mechanical tolerances. In addition to the beam-focusing functions described for the electron-beam device 700 (FIG. 7), the magnetic-lens stack 800 may be used to correct image rotations for the plurality of electron beamlets 706 by applying opposite currents (i.e., currents of opposite directions) to different coils of respective lenses 804, 806, 808, and 810.

FIG. 9 shows optics 900 for an electron-beam device in which the patterned photocathode film 102 is replaced with a photocathode film 906 that emits a plurality of electron beamlets when illuminated from the back side by a plurality of optical beamlets 904, in accordance with some embodiments. The photocathode film 906 is disposed on the substrate 108. The photocathode film 906 may be unpatterned (e.g., flat) and is sufficiently thin (e.g., with a thickness of 10-20 nm) to allow for photoemission in response to illumination by the plurality of optical beamlets 904. The plurality of optical beamlets 904 illuminates respective regions 908 of the photocathode film 906. The plurality of electron beamlets (e.g., electron beamlets 320, FIG. 3) is emitted from the respective regions 908 when the respective regions 908 are illuminated by the plurality of optical beamlets 904. Electron beamlets are not emitted from regions of the photocathode film 906 that are not illuminated. In some embodiments, the photocathode film 906 is gold. Other examples of the photocathode film 906 include, without limitation, III-V semiconductors, cesium telluride (CsTe), and chalcogenides. In some embodiments, the photocathode film 906 is a material with negative electron affinity.

The optics 900 include the laser 501 (FIG. 5), which generates a laser beam 502, and may include the pair of lenses 504 and 506 (FIG. 5), which magnify the laser beam 502. A light-aperture array 902 divides the laser beam 502 (e.g., as magnified by the pair of lenses 504 and 506) into the plurality of optical beamlets 904. The light-aperture array (LAA) 902 is disposed between the laser 501 and the back side of the photocathode film 906 (and between the laser 501 and the substrate 108). (The back side of the photocathode film 906 is the side facing the substrate 108.) For example, the pair of lenses 504 and 506 are disposed between the laser 501 and the light-aperture array 902, with the light-aperture array 902 being disposed between the second lens 506 and the substrate 108. In some embodiments, the light-aperture array 902 is deposited on the substrate 108. Because the plurality of optical beamlets 904 that illuminate the photocathode film 906 originate from the laser 501, the photocathode film 906 is illuminated using the laser 501. The light-aperture array 902 is an array of apertures; in some embodiments, the apertures of the light-aperture array 902 are arranged hexagonally as shown in FIG. 2. In some embodiments, the bore size (e.g., the diameter) of the apertures of the light-aperture array 902 is in the range of 10-30 um.

In some embodiments, the laser 501 is pulsed, resulting in pulsing of the laser beam 502, the plurality of optical beamlets 904, and the plurality of electron beamlets emitted from the photocathode film 906. In some embodiments, the laser beam 502 is circularly polarized, resulting in circular polarization of the plurality of optical beamlets 904 and corresponding polarization of the plurality of electron beamlets emitted from the regions 908 of the photocathode film 906.

The optics 900 and photocathode film 906 may be combined with the electron-optical column of the electron-beam device 100 (FIG. 1) (e.g., of the electron-beam device 300, FIGS. 3-4). For example, the optics 900 and photocathode film 906 may be combined with the electron-optical column of the electron-beam device 600 (FIG. 6) or 700 (FIG. 7).

As discussed, the photocathode film 102 or 906 is disposed on the front side of a substrate 108. In some embodiments, the substrate 108 is integrated into a vacuum chamber 130 of an electron-optical column. The front side of the substrate 108 faces into the vacuum chamber 130, such that the photocathode film 102 or 906 is situated within the vacuum chamber 130. The back side of the substrate 108, which is to be illuminated using a laser (e.g., the laser 501, FIG. 5 or 9), is exposed to air. Accordingly, the optics of the electron-beam device may be in air, while the electron optics are in vacuum.

Figure 10:
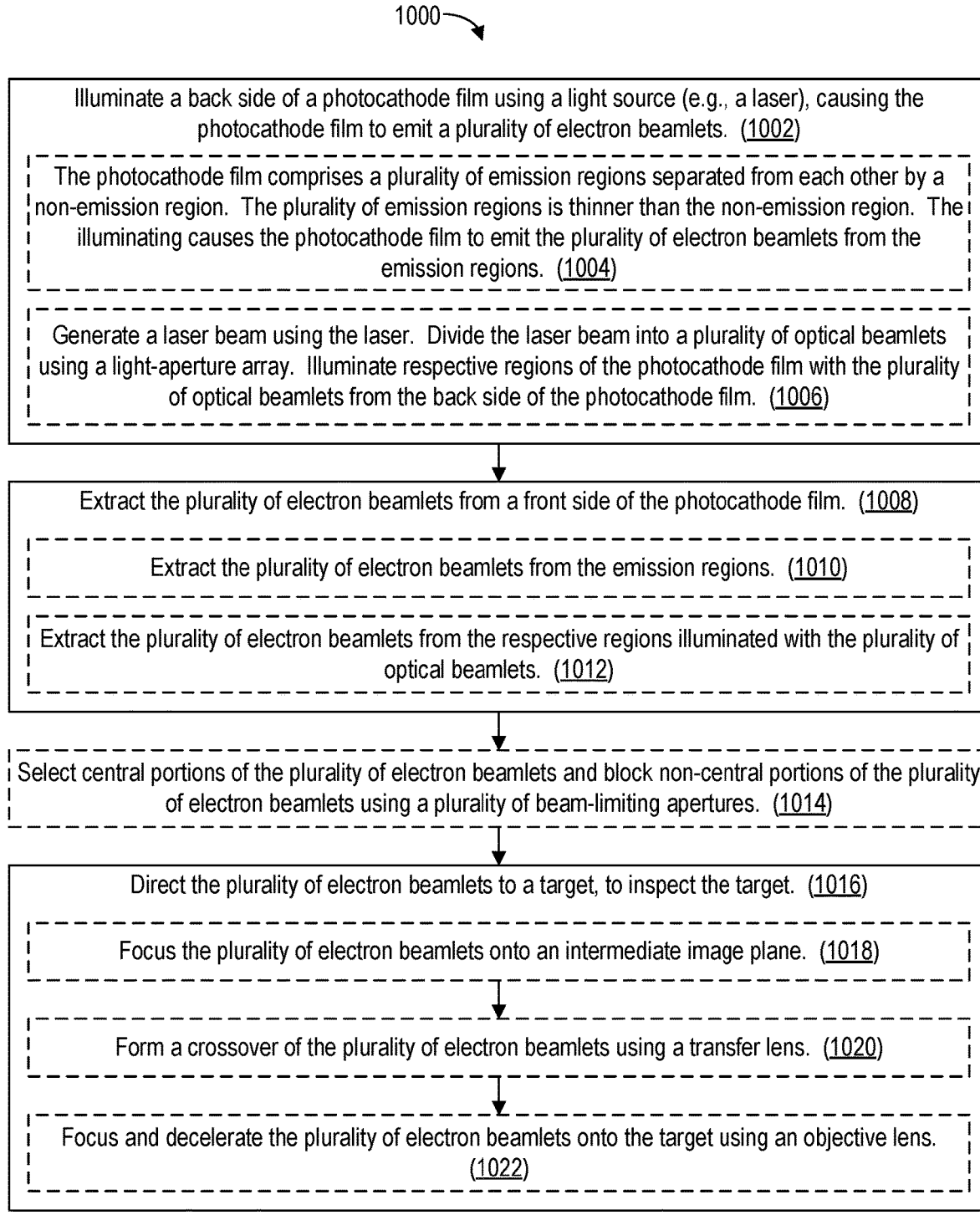
FIG. 10 is a flowchart showing a method of operating an electron-beam device, in accordance with some embodiments.

FIG. 10 is a flowchart showing a method 1000 of operating an electron-beam device (e.g., electron beam device 100, FIG. 1; 300, FIGS. 3-4; 600; FIG. 6; 700, FIG. 7), in accordance with some embodiments. In the method 1000, a back side of a photocathode film is illuminated (1002) using a light source, which may be a laser (e.g., laser 501, FIG. 5 or 9), causing the photocathode film to emit a plurality of electron beamlets. The light that illuminates the photocathode film may be pulsed and/or circularly polarized, resulting in pulsing and/or polarization of the plurality of electron beamlets.

In some embodiments, the photocathode film (e.g., photocathode film 102, FIG. 1; 200, FIG. 2) includes (1004) a plurality of emission regions (e.g., emission regions 104, FIG. 1; 204, FIG. 2) separated from each other by a non-emission region (e.g., non-emission region 106, FIG. 1; 202, FIG. 2). The plurality of emission regions is thinner than the non-emission region. Illuminating the back side of a photocathode film causes the photocathode film to emit the plurality of electron beamlets from the emission regions.

In some other embodiments, a laser beam (e.g., laser beam 502, FIG. 9) is generated (1006) using the laser and divided into a plurality of optical beamlets (e.g., optical beamlets 904, FIG. 9) using a light-aperture array (e.g., light-aperture array 902, FIG. 9). Respective regions (e.g., regions 908, FIG. 9) of the photocathode film (e.g., photocathode film 906, FIG. 9) are illuminated (1006) with the plurality of optical beamlets from the back side of the photocathode film.

The plurality of electron beamlets is extracted (1008) from a front side of the photocathode film. The plurality of electron beamlets may be extracted using an extractor electrode (e.g., extractor electrode 114, FIGS. 1, 6, and/or 7; 314, FIGS. 3-4).

In some embodiments, the plurality of electron beamlets is extracted (1010) from the emission regions of step 1004 (e.g., emission regions 104, FIG. 1; 204, FIG. 2). In some other embodiments, the plurality of electron beamlets is extracted (1012) from the respective regions (e.g., regions 908, FIG. 9) illuminated with the plurality of optical beamlets in step 1006.

Central portions of the plurality of electron beamlets may be selected and non-central portions of the plurality of electron beamlets may be blocked (1014) using a plurality of beam-limiting apertures (e.g., plurality of beam-limiting apertures 118, FIGS. 1, 6, and/or 7).

The plurality of electron beamlets is directed (1016) to a target (e.g., target 622, FIG. 6 or 7), to inspect the target. In some embodiments, the target is a semiconductor wafer. Directing the plurality of electron beamlets may include controlling shapes of the plurality of electron beamlets using a Wehnelt electrode (e.g., Wehnelt electrode 112, FIGS. 1, 6, and/or 7; 312, FIGS. 3-4) and accelerating the plurality of electron beamlets using an anode (e.g., anode 116, FIGS. 1, 6, and/or 7). The Wehnelt electrode is disposed between the front side of the photocathode film and the extractor electrode. The extractor electrode is disposed between the Wehnelt electrode and the anode. The anode may be disposed between the extractor electrode and the plurality of beam-limiting apertures, and may have openings for the plurality of electron beamlets with a bore size that is larger than a bore size of the plurality of beam-limiting apertures.

In some embodiments, as part of directing the plurality of electron beamlets to the target, the plurality of electron beamlets is focused (1018) onto an intermediate image plane (e.g., intermediate image plane 604 or 704, FIG. 6 or 7). In some embodiments, this focusing is performed using an image-lens array disposed between the anode and the intermediate image plane (e.g., image-lens array 602, FIG. 6). In some other embodiments, this focusing is performed using a global image lens disposed between the anode and the intermediate image plane (e.g., global image lens 702, FIG. 7). The focusing as performed using the global image lens includes forming a crossover of the plurality of electron beamlets between the global image lens and the intermediate image plane (e.g., crossover 708, FIG. 7), and directing the plurality of electron beamlets to the target further includes collimating the plurality of electron beamlets as focused onto the intermediate image plane. The collimation may be performed using a field lens (e.g., field lens 710, FIG. 7).

A crossover of the plurality of electron beamlets (e.g., crossover 618, FIG. 6 or 7), situated on an opposite side of the intermediate image plane from the anode, is formed (1020) using a transfer lens (e.g., transfer lens 610, FIG. 6 or 7). (This crossover is distinct from the crossover that may be formed by the global image lens.) The plurality of electron beamlets is focused and decelerated (1022) onto the target using an objective lens (e.g., objective lens 620, FIG. 6 or 7). The objective lens is disposed between this crossover and the target.

The method 1000 may further include using first and second Wien filters. The second Wien filter (e.g., second Wien filter 616, FIG. 6 or 7), which is closer to the objective lens than is the first Wien filter (e.g., first Wien filter 612, FIG. 6 or 7), deflects secondary electrons from the target to a detector (e.g., detector 614, FIG. 6 or 7). The first Wien filter compensates for effects of the second Wien filter on the plurality of electron beamlets.

In some embodiments of the method 1000, the photocathode film is disposed on a front side of a substrate (e.g., substrate 108, FIGS. 1, 6, 7, and/or 9) that is integrated into an electron-optical column. The photocathode film, as disposed on the front side of the substrate, is exposed to a vacuum (e.g., in vacuum chamber 130, FIGS. 1, 3-7, and/or 9) in the electron-optical column. The back side of the substrate is exposed to air (e.g., air 132, FIGS. 1, 3-7, and/or 9).

Multiple iterations of the method 1000 may be performed. For example, different iterations of the method 1000 may be performed to inspect different targets and/or to inspect the same target repeatedly. The laser power may be adjusted between iterations. Different laser powers, and thus different electron-beamlet currents corresponding to the different laser powers, may therefore be used to inspect different targets and/or to inspect the same target repeatedly. For example, a first iteration of the method 1000 may be performed for a first target, with the laser configured to have a first laser power. After the first iteration is complete, the laser may then be reconfigured to have a second laser power distinct from (e.g., greater than or less than) the first laser power. A second iteration of the method 1000 may then be performed for a second target using the laser as reconfigured to have the second laser power. Alternatively, the second iteration may be performed for the first target, using the laser as reconfigured to have the second laser power. In some embodiments, settings for electron-optical components in the vacuum of the electron-optical column are not changed between iterations and the electron-optical column is not recalibrated between iterations. Instead, the laser is reconfigured to change the laser power without adjusting the settings for the electron-optical components in the vacuum and without recalibrating the electron-optical column.

While the operations of the method 1000 appear to occur in a specific order in FIG. 10, they may all be performed simultaneously (e.g., on an on-going basis). The method 1000 can include more or fewer operations than shown. Two or more operations may be combined into a single operation.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electron-beam device, comprising:
   a laser;
   a photocathode film having a front side and a back side, to emit a plurality of electron beamlets when illuminated from the back side using the laser; and
   electrodes to extract the plurality of electron beamlets from the front side of the photocathode film and to control shapes of the plurality of electron beamlets, the electrodes comprising:
   a Wehnelt electrode having a first plurality of openings for the plurality of electron beamlets,
   an extractor electrode having a second plurality of openings for the plurality of electron beamlets, and
   an anode having a third plurality of openings for the plurality of electron beamlets, wherein:
   the Wehnelt electrode is disposed between the front side of the photocathode film and the extractor electrode; and
   the extractor electrode is disposed between the Wehnelt electrode and the anode.

2. The electron-beam device of claim 1, wherein:
   the photocathode film comprises a plurality of emission regions separated from each other by a non-emission region;

the plurality of emission regions is thinner than the non-emission region; and the plurality of electron beamlets is to be emitted from the plurality of emission regions when the back side of the photocathode film is illuminated using the laser.

3. The electron-beam device of claim 2, wherein:
the photocathode film is gold; and
the plurality of emission regions has a first thickness of 10-20 nm.

4. The electron-beam device of claim 3, wherein the non-emission region has a second thickness that is at least five times as thick as the first thickness.

5. The electron-beam device of claim 1, further comprising a light-aperture array, disposed between the laser and the back side of the photocathode film, to divide a laser beam from the laser into a plurality of optical beamlets to illuminate respective regions of the photocathode film from the back side of the photocathode film;
wherein the plurality of electron beamlets is to be emitted from the respective regions when the respective regions are illuminated by the plurality of optical beamlets.

6. The electron-beam device of claim 5, further comprising a pair of lenses, disposed between the laser and the light-aperture array, to magnify the laser beam.

7. The electron-beam device of claim 1, further comprising a plurality of beam-limiting apertures to select central portions of the plurality of electron beamlets and block non-central portions of the plurality of electron beamlets, wherein:
the anode is disposed between the extractor electrode and the plurality of beam-limiting apertures; and
a bore size of the third plurality of openings of the anode is larger than a bore size of the plurality of beam-limiting apertures.

8. The electron-beam device of claim 1, further comprising image lensing to focus the plurality of electron beamlets onto an intermediate image plane.

9. The electron-beam device of claim 8, wherein the image lensing comprises an image-lens array, disposed between the anode and the intermediate image plane, to focus the plurality of electron beamlets onto the intermediate image plane.

10. The electron-beam device of claim 8, wherein:
the image lensing comprises a global image lens, disposed between the anode and the intermediate image plane, to form a crossover of the plurality of electron beamlets and to focus the plurality of electron beamlets onto the intermediate image plane after the crossover, wherein the crossover is situated between the global image lens and the intermediate image plane; and
the electron-beam device further comprises a field lens, coincident with the intermediate image plane, to collimate the plurality of electron beamlets.

11. The electron-beam device of claim 8, further comprising:
a transfer lens, disposed on an opposite side of the intermediate image plane from the image lensing, to form a crossover of the plurality of electron beamlets; and
an objective lens to focus the plurality of electron beamlets onto a target;
wherein the crossover is situated between the transfer lens and the objective lens.

12. The electron-beam device of claim 11, further comprising a first Wien filter and a second Wien filter disposed between the transfer lens and the objective lens, wherein:

the second Wien filter is closer to the objective lens than is the first Wien filter;
the second Wien filter is to deflect secondary electrons from the target to a detector; and
the first Wien filter is to compensate for the second Wien filter.

13. The electron-beam device of claim 1, wherein:
the photocathode film is disposed on a front side of a substrate;
the substrate is integrated into an electron-optical column that comprises a vacuum chamber;
the front side of the substrate faces into the vacuum chamber, the photocathode film being situated within the vacuum chamber; and
a back side of the substrate, to be illuminated using the laser to illuminate the back side of the photocathode film, is exposed to air.

14. The electron-beam device of claim 1, wherein the laser has an adjustable laser power to vary currents of the plurality of plurality of electron beamlets.

15. A method of operating an electron-beam device, comprising:
illuminating a back side of a photocathode film using a laser, causing the photocathode film to emit a plurality of electron beamlets;
extracting the plurality of electron beamlets from a front side of the photocathode film using an extractor electrode; and
directing the plurality of electron beamlets to a target, to inspect the target, the directing comprising:
controlling shapes of the plurality of electron beamlets using a Wehnelt electrode, and
accelerating the plurality of electron beamlets using an anode, wherein:
the Wehnelt electrode is disposed between the front side of the photocathode film and the extractor electrode; and
the extractor electrode is disposed between the Wehnelt electrode and the anode.

16. The method of claim 15, wherein:
the photocathode film comprises a plurality of emission regions separated from each other by a non-emission region;
the plurality of emission regions is thinner than the non-emission region;
the illuminating causes the photocathode film to emit the plurality of electron beamlets from the emission regions; and
the extracting comprises extracting the plurality of electron beamlets from the emission regions.

17. The method of claim 15, wherein:
the illuminating comprises:
generating a laser beam using the laser,
dividing the laser beam into a plurality of optical beamlets using a light-aperture array, and
illuminating respective regions of the photocathode film with the plurality of optical beamlets from the back side of the photocathode film; and
the extracting comprises extracting the plurality of electron beamlets from the respective regions.

18. The method of claim 15, further comprising selecting central portions of the plurality of electron beamlets and blocking non-central portions of the plurality of electron beamlets using a plurality of beam-limiting apertures, wherein:
the anode is disposed between the extractor electrode and the plurality of beam-limiting apertures; and a bore size of openings in the anode for the plurality of electron beamlets is larger than a bore size of the plurality of beam-limiting apertures.

19. The method of claim 15, wherein the directing further comprises focusing the plurality of electron beamlets onto an intermediate image plane.

20. The method of claim 19, wherein focusing the plurality of electron beamlets onto the intermediate image plane is performed using an image-lens array disposed between the anode and the intermediate image plane.

21. The method of claim 19, wherein:
focusing the plurality of electron beamlets onto the intermediate image plane is performed using a global image lens disposed between the anode and the intermediate image plane;
focusing the plurality of electron beamlets onto the intermediate image plane comprises forming a crossover of the plurality of electron beamlets between the global image lens and the intermediate image plane; and
the directing further comprises collimating the plurality of electron beamlets as focused onto the intermediate image plane, using a field lens.

22. The method of claim 15, wherein the directing further comprises:
forming a crossover of the plurality of electron beamlets using a transfer lens, wherein the crossover is situated on an opposite side of the intermediate image plane from the anode; and
focusing and decelerating the plurality of electron beamlets onto the target using an objective lens, wherein the objective lens is disposed between the crossover and the target.

23. The method of claim 22, further comprising:
using a first Wien filter to compensate for effects of a second Wien filter on the plurality of electron beamlets, wherein the second Wien filter is closer to the objective lens than the first Wien filter; and
deflecting secondary electrons from the target to a detector, using the second Wien filter.

24. The method of claim 15, wherein:
the photocathode film is disposed on a front side of a substrate;
the substrate is integrated into an electron-optical column; and
the method further comprises:
exposing the photocathode film, as disposed on the front side of the substrate, to a vacuum in the electron-optical column; and
exposing the back side of the substrate to air.

25. The method of claim 15, wherein the target is a first target and the illuminating is performed with the laser configured to have a first laser power, the method further comprising:
after performing the illuminating, the extracting, and the directing, reconfiguring the laser to have a second laser power distinct from the first laser power; and
with the laser reconfigured to have the second laser power, repeating the illuminating, the extracting, and the directing to inspect a second target.

26. The method of claim 15, wherein the illuminating is performed with the laser configured to have a first laser power, the method further comprising:
after performing the illuminating, the extracting, and the directing, reconfiguring the laser to have a second laser power distinct from the first laser power; and
with the laser reconfigured to have the second laser power, repeating the illuminating, the extracting, and the directing.

27. The method of claim 15, wherein the illuminating is performed using circularly polarized light from the laser.

28. The method of claim 15, wherein the illuminating is performed using pulsed light from the laser.

* * * * *